US008236103B2

(12) United States Patent
Miki et al.

(10) Patent No.: US 8,236,103 B2
(45) Date of Patent: Aug. 7, 2012

(54) GROUP III NITRIDE SEMICONDUCTOR CRYSTAL, PRODUCTION METHOD THEREOF AND GROUP III NITRIDE SEMICONDUCTOR EPITAXIAL WAFER

(75) Inventors: Hisayuki Miki, Chiba (JP); Tetsuo Sakurai, Chiba (JP); Mineo Okuyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 596 days.

(21) Appl. No.: 10/504,584

(22) PCT Filed: Feb. 14, 2003

(86) PCT No.: PCT/JP03/01558
§ 371 (c)(1),
(2), (4) Date: Mar. 31, 2005

(87) PCT Pub. No.: WO03/068699
PCT Pub. Date: Aug. 21, 2003

(65) Prior Publication Data
US 2005/0227453 A1 Oct. 13, 2005

Related U.S. Application Data

(60) Provisional application No. 60/367,719, filed on Mar. 28, 2002.

(30) Foreign Application Priority Data

Feb. 15, 2002 (JP) .................................. 2002-38841

(51) Int. Cl.
*C30B 23/00* (2006.01)

(52) U.S. Cl. .............. 117/102; 117/84; 117/88; 117/89; 117/93; 117/104; 117/105; 117/952

(58) Field of Classification Search .................... 117/84, 117/88, 89, 93, 102, 104, 105, 952
See application file for complete search history.

(56) References Cited

U.S. PATENT DOCUMENTS

| 6,153,010 | A  | * | 11/2000 | Kiyoku et al. | 117/95 |
| 6,478,871 | B1 | * | 11/2002 | Shealy et al. | 117/84 |
| 6,673,149 | B1 | * | 1/2004  | Solomon et al. | 117/90 |
| 6,846,754 | B2 | * | 1/2005  | Udagawa et al. | 438/778 |
| 2001/0023942 | A1 | | 9/2001 | Kim et al. | |

(Continued)

FOREIGN PATENT DOCUMENTS
CN 1313412 A 9/2001
(Continued)

OTHER PUBLICATIONS

Japanese Office Action for Japanese Patent Application No. 2002-038841 dated Aug. 18, 2004.

(Continued)

*Primary Examiner* — Matthew Song
(74) *Attorney, Agent, or Firm* — Sughrue Mion, PLLC

(57) ABSTRACT

A method for producing a Group III nitride semiconductor crystal includes a first step of supplying a Group III raw material and a Group V raw material at a V/III ratio of 0 to 1,000 to form and grow a Group III nitride semiconductor on a heated substrate and a second step of vapor-phase-growing a Group III nitride semiconductor crystal on the substrate using a Group III raw material and a nitrogen raw material.

13 Claims, 1 Drawing Sheet

U.S. PATENT DOCUMENTS

| | | | |
|---|---|---|---|
| 2002/0014629 A1* | 2/2002 | Shibata et al. | 257/79 |
| 2002/0078881 A1* | 6/2002 | Cuomo et al. | 117/84 |
| 2002/0081463 A1* | 6/2002 | Shibata et al. | 428/698 |
| 2002/0190259 A1* | 12/2002 | Goetz et al. | 257/79 |

FOREIGN PATENT DOCUMENTS

| | | |
|---|---|---|
| JP | 63-103894 | 5/1988 |
| JP | 4-297023 | 10/1992 |
| JP | 8-208395 | 8/1996 |
| JP | 9-63962 | 3/1997 |
| JP | 9-64477 | 3/1997 |
| JP | 9-186091 | 7/1997 |
| JP | 10-12555 | 1/1998 |
| JP | 10-70076 | 3/1998 |
| JP | 10-125608 | 5/1998 |
| JP | 11-219910 | 8/1999 |
| JP | 3026087 | 1/2000 |
| JP | 2000-315818 | 11/2000 |
| JP | 2001-185488 | 7/2001 |
| JP | 2002-43618 | 2/2002 |
| KR | 2001-0090165 | 10/2001 |
| WO | WO 02/01608 A2 | 1/2002 |

OTHER PUBLICATIONS

X.H. Wu, et al.; "Nucleation layer evolution in metal-organic chemical vapor deposition grown GaN"; Appl. Phys. Lett., vol. 68, No. 10, Mar. 4, 1996, pp. 1371-1373.

Takahiro Ito, et al.; "Effect of AlN buffer layer deposition conditions on the properties of GaN layer"; Journal of Crystal Growth, vol. 205, 1999, pp. 20-24.

Fuh-Shyang Juang, et al.; "Effect of diluted ammonia flow rate on undoped GaN epitaxial films grown by MOCVD"; Journal of Crystal Growth, vol. 225, 2001, pp. 145-149.

K. Hiramatsu, et al.; "Growth mechanism of GaN grown on sapphire with AlN buffer layer by MOVPE"; Journal of Crystal Growth, vol. 115, 1991, pp. 628-633.

P. Kung, et al.; High Quality AlN and GaN Epilayers Grown on (00-1) Sapphire, (100), and (111) Silicon Substrates; Appl. Phys. Lett., vol. 66, No. 22, May 29, 1995; pp. 2958-2960.

Patent Abstracts of Japan vol. 2000, No. 13, Feb. 5, 2001.

Patent Abstracts of Japan vol. 2002, No. 04, Aug. 4, 2002.

International Search Report, dated Aug. 26, 2003.

* cited by examiner

GROUP III NITRIDE SEMICONDUCTOR CRYSTAL, PRODUCTION METHOD THEREOF AND GROUP III NITRIDE SEMICONDUCTOR EPITAXIAL WAFER

CROSS REFERENCE TO RELATED APPLICATIONS

This application is an application filed under 35 U.S.C. §111(a) claiming the benefit pursuant to 35 U.S.C. §119(e)(1) of the filing date of Provisional Application Ser. No. 60/367,719 filed Mar. 28, 2002 pursuant to 35 U.S.C. §111(b)

TECHNICAL FIELD

The present invention relates to a Group III nitride semiconductor (the Group III nitride semiconductor is shown by InGaAlN) crystal having good crystallinity, which is used for the manufacture of a light-emitting diode (LED), a laser diode (LD), an electronic device and the like, to a production method thereof and to a Group III nitride semiconductor epitaxial wafer having a Group III nitride semiconductor crystal layer formed on the Group III nitride semiconductor crystal. Particularly, the present invention relates to a method for producing a Group III nitride semiconductor crystal, which can be suitably used for epitaxially growing a Group III nitride semiconductor crystal having good crystallinity on a sapphire substrate.

BACKGROUND ART

A Group III nitride semiconductor has a direct transition-type band gap corresponding to the region from visible light to ultraviolet light and can realize highly efficient light emission. Therefore, it is formed into an LED or LD. Furthermore, for example, a two-dimensional electron layer appears on the hetero junction interface between aluminum gallium nitride (AlGaN) and gallium nitride (GaN) due to the piezoelectric effect characteristic of the Group III nitride semiconductor. Thus, there is a potential of providing an electronic device having properties that are not obtained by conventional Group III-V compound semiconductors.

However, the Group III nitride semiconductor is difficult to grow as a single crystal because the dissociation pressure of nitrogen reaches as high as 2,000 atm at the growth temperature of the single crystal. Therefore, unlike Group III-V compound semiconductors, a single crystal substrate of the Group III nitride semiconductor cannot be used at present as the substrate for use in the epitaxial growth. As the substrate for use in the epitaxial growth, a substrate composed of a heterogeneous material, such as sapphire ($Al_2O_3$) single crystal or silicon carbide (SiC) single crystal, is used.

Between such a heterogeneous substrate and the Group III nitride semiconductor crystal epitaxially grown on the substrate, a large lattice mismatch is present. For example, there is present a lattice mismatch of 16% between sapphire ($Al_2O_3$) and gallium nitride (GaN), and that of 6% between SiC and gallium nitride. When such a large lattice mismatch is present, it is generally difficult to epitaxially grow a crystal on the substrate. Even if grown, a crystal having good crystallinity cannot be obtained. Therefore, in the case of epitaxially growing a Group III nitride semiconductor on a substrate of sapphire single crystal or SiC single crystal by the metal-organic chemical vapor deposition (MOCVD) method, a method of first depositing a low-temperature buffer layer composed of aluminum nitride (AlN) or AlGaN on the substrate and then epitaxially growing a Group III nitride semiconductor crystal thereon at a high temperature is generally employed, as disclosed in Japanese Patent 3,026,087 and JP-A HEI 4-297023 (the term "JP-A" as used herein means an "unexamined published Japanese patent application").

Other than the growth method using a low-temperature buffer layer, a method of growing and thereby forming an AlN layer on a substrate at a high growth temperature on the order of 900 to 1,200° C. and then growing gallium nitride thereon is disclosed, for example, in Applied Physics Letters, P. Kung, et al., 66, 2958 (1995) and JP-A HEI 9-64477.

In the case of using sapphire as the substrate, the above-described low-temperature buffer layer is generally formed as follows.

First, the sapphire substrate is heated to a high temperature of 1,000 to 1,200° C. in a growing apparatus for the MOCVD method to remove the oxide film or the like from the surface. Then, the temperature of the growing apparatus is lowered and at a temperature on the order of 400 to 600° C., a low-temperature buffer layer is deposited on the substrate by simultaneously supplying a raw material organic metal and a nitrogen source to give a V/III ratio of 3,000 to 10,000. Here, the V/III ratio is a ratio of the molar number of molecules containing the Group III element and that of molecules containing the Group V element, which are passing in the reaction furnace at the time of growing a Group III-V compound semiconductor crystal by the MOCVD method. For example, in the case of growing gallium nitride using TMGa and ammonia, this ratio is a ratio of the molar number of TMGa and that of ammonia, which are passing in the reaction furnace. Thereafter, the supply of the raw material organic metal is stopped, the temperature of the growing apparatus is again elevated to perform a heat treatment called crystallization of a low-temperature buffer layer, and then the objective Group III nitride semiconductor crystal is epitaxially grown.

At a temperature of 400 to 600° C. that is a temperature for depositing the low-temperature buffer layer, thermal decomposition of the raw material organic metal and nitrogen source used as starting materials, particularly ammonia used as the nitrogen source, proceeds insufficiently. Accordingly, the low-temperature buffer layer deposited at such a low temperature and left intact contains many defects. Furthermore, since the starting materials are reacted at a low temperature, a polymerization reaction occurs between the alkyl group of the raw material organic metal and the undecomposed nitrogen source, and the reactant thereof and other impurities are also contained in a large amount in the crystal of the low-temperature buffer layer.

For eliminating these defects and impurities, a heat-treating step called crystallization of a low-temperature buffer layer is performed. The step of crystallizing the buffer layer includes heat-treating the low-temperature buffer layer containing many impurities and defects at a high temperature dose to the epitaxial growth temperature of the Group III nitride semiconductor crystal to thereby remove the impurities and defects.

As such, in the growth method using a low-temperature buffer layer, the substrate temperature must be lowered from 1,200° C. as a temperature for thermal cleaning to around 500° C. as a temperature for growing a buffer layer and subsequently elevated from around 500° C. to a temperature region close to 1,000° C. as an annealing temperature within a relatively short time. At this time, generally, the change of temperature accompanying the cooling takes a long time and the abrupt increase of the temperature requires a large amount of energy.

Furthermore, these various temperature histories given to the substrate cause warping of the substrate, and the warped substrate may be cracked or crazed. Also, the warping of the substrate affects the crystal layer grown thereon and particularly in the manufacture of an LED structure, the emission wavelength or emission intensity becomes inhomogeneous in the substrate plane.

Other than such a growth method using a low-temperature buffer layer, a method of growing and thereby forming AlN on a substrate at a high growth temperature on the order of 900 to 1,200° C. and then growing gallium nitride thereon is disclosed (see, for example, Applied Physics Letters, P. Kung, et al., 66, 2958 (1995)). In this publication, it is stated that a very good crystal of 30 arc sec as the X-ray rocking curve of the (0002) plane can be produced by this method. However, according to the test performed by the present inventors, the gallium nitride crystal film produced by this technique is found to be a crystal having very high columnarity and contain a large number of grain boundaries within the crystal. Such a crystal is high in the density of threading dislocations generated from the substrate toward the surface. Therefore, even if a device structure, such as light-emitting device and electronic device, is manufactured, good properties cannot be obtained.

The growth method using an AlN layer produced at high temperature is also described in JP-A HEI 9-64477. This patent publication states that the manufactured Group III nitride semiconductor crystal is preferably a single crystal having good crystallinity. Though the present inventors conducted repeated tests, a crystal capable of providing a device structure having good properties could not be grown by the growth method using a good single crystal AlN film described in this patent publication. This is considered to occur because when a single crystal layer having good crystallinity is used as the buffer layer, migration of atoms attached does not proceed successfully at the initial stage of growth on growing a Group III nitride semiconductor thereon and the two-dimensional growth hardly takes place.

As such, a Group III nitride semiconductor crystal having crystallinity high enough to produce a device cannot be obtained and the method of growing a Group III nitride semiconductor crystal using an AlN buffer layer grown at high temperature is not commonly used at present.

One object of the present invention is to provide a method for producing a Group III nitride semiconductor crystal, which can take the place of the method using a low-temperature buffer layer and requiring setting of many temperature regions or the method using a high-temperature AlN layer and having a problem in the crystal quality, and can form a high-quality Group III nitride semiconductor crystal through steps relatively reduced in the change of temperature.

Another object of the present invention is to provide a method for producing a Group III nitride semiconductor crystal, which enables a high-quality Group III nitride semiconductor crystal to be epitaxially grown on a sapphire substrate.

Still another object of the present invention is to provide a Group III nitride semiconductor epitaxial wafer that can advantageously be used for an LED, electronic device or similar device.

DISCLOSURE OF THE INVENTION

The present invention provides a method for producing a Group III nitride semiconductor crystal, comprising a first step of supplying a Group III raw material and a Group V raw material at a V/III ratio of 0 to 1,000 to form and grow a Group III nitride semiconductor on a heated substrate and a second step of vapor-phase-growing a Group III nitride semiconductor crystal on the substrate using a Group III raw material and a nitrogen raw material.

In the method, the substrate is a sapphire ($Al_2O_3$) substrate.

In the method, the Group III raw material supplied in the first step contains at least Al.

In the method, the Group III nitride semiconductor crystal vapor-phase-grown on the substrate in the second step comprises GaN.

In the method, in at least one of the first step and the second step, the growth is performed by the metal-organic chemical vapor deposition (MOCVD) method.

In the method, the nitrogen raw material used in the second step is ammonia ($NH_3$).

In the method, the Group III nitride semiconductor formed in the first step is an island-like crystal grain In the method, the Group III nitride semiconductor formed in the first step is a columnar crystal.

In the method just described above, the columnar crystal is attached onto the substrate such that a side surface of the columnar crystal stands approximately perpendicular to a surface of the substrate.

The present invention also provides a method for producing a Group III nitride semiconductor crystal, comprising producing a first Group III nitride semiconductor on a heated substrate and producing a second Group III nitride semiconductor crystal on the first Group III nitride semiconductor, wherein the first Group III nitride semiconductor is an aggregate of columnar crystals or island-like crystals.

In the method, the columnar crystals are attached onto the substrate such that each side surface of the columnar crystals stands approximately perpendicular to a surface of the substrate.

The present invention also provides a Group III nitride semiconductor crystal produced by any one of the methods described above.

The present invention also provides a Group III nitride semiconductor epitaxial wafer having a Group III nitride semiconductor crystal layer formed on the Group III nitride semiconductor crystal just described above.

According to the method of the present invention, wherein the raw materials are supplied at a V/III ratio of 1,000 or less to form an aggregate of columnar or island-like crystals in the first step, as described above, it is made possible to produce a Group III nitride semiconductor crystal that can give good properties to a device.

By forming on the Group III nitride semiconductor crystal a Group III nitride semiconductor crystal layer and forming on the crystal layer an epitaxial wafer for use in the production of an LED or electronic device, it is made possible to obtain various high-quality devices.

BEST MODE FOR CARRYING OUT THE INVENTION

Figure 1:
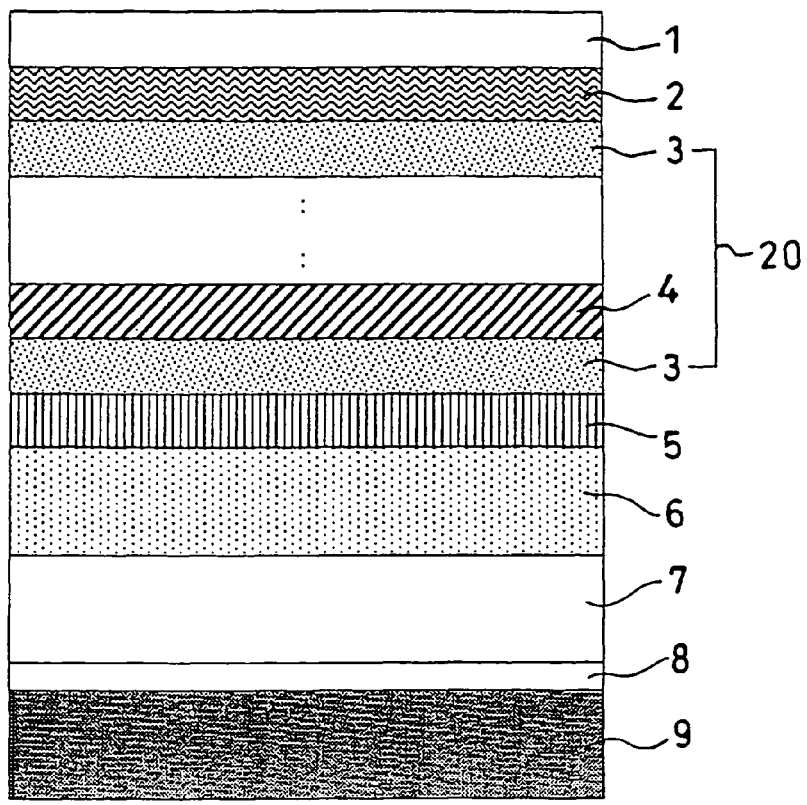
FIG. 1 is a schematic view showing the cross section of the epitaxial wafer having an epitaxial layer structure for the semiconductor light-emitting device according to Example 5 of the present invention.

The method of the present invention for producing a Group III nitride semiconductor crystal comprises a first step of supplying Group III and Group V raw materials at a V/III ratio of 1,000 or less (including the case where the V/III ratio is 0) to form and grow a Group III nitride semiconductor on a heated substrate and a second step of vapor-phase-growing a Group III nitride semiconductor crystal on the substrate using a Group III raw material and a nitrogen raw material. By this production method of a Group III nitride semiconductor crystal having first and second steps, a group III nitride semiconductor crystal having good crystallinity can be formed on the substrate. In the present invention, the Group III nitride semiconductor is shown as InGaAlN.

It is considered that in the Group III nitride semiconductor crystal produced under the low V/III ratio condition where the V/III ratio is 1,000 or less, the stoichiometric ratio of the Group V element and the Group III element in the crystal is not 1:1 and the Group III element is shifted to the excess side to provide an excess metal state. In such a Group III nitride semiconductor crystal layer, the excess Group III element is present as a metal crystal or liquid droplet. Therefore, when a Group III nitride semiconductor crystal is grown on the crystal layer, migration at the initial stage of growth proceeds efficiently to enable the two-dimensional growth in the transverse direction. However, details of the mechanism are not known.

An AlN film produced at a small V/III ratio is preferred for growing a good Group III nitride semiconductor and this is described also in TP-A HEI 9-64477. However, this patent publication states that the formed Group III nitride semiconductor crystal is preferably a single crystal having good crystallinity. The present inventors have performed repeated tests and analyses and have found that an aggregate of columnar crystals or island-like crystals more successfully functions as a buffer layer than the single crystal film. This is considered to occur because the metal crystal or liquid droplet enters into the grain boundaries present in the layer comprising columnar crystals or island-like crystals and a more metal-excess crystal is readily produced. However, the details thereof are not known.

This method is reduced in the occasion of elevating or lowering the temperature as compared with the conventional method using a low-temperature buffer layer and therefore, can be short in the process and small in the consumption of electric power. Accordingly, the production process and cost can be curtailed. Furthermore, by virtue of small change in the temperature, the warping of a substrate can be suppressed to the minimum and the device can have good homogeneity of properties. In addition, a crystal giving good properties to a device can be produced as compared with the growth method using an AlN layer grown at a high temperature, which has heretofore been disclosed.

In the present invention, glass, SiC, Si, GaAs, sapphire and the like can be used as the substrate. In particular, the substrate for use in the present invention is preferably sapphire ($Al_2O_3$). Use of sapphire as the substrate is advantageous in that a high-quality substrate is available at a low cost.

As for the plane orientation of a sapphire substrate, an m plane, an a plane, a c plane and the like can be used and among these, the c plane ((0001) plane) is preferred. Furthermore, the vertical axis on the substrate surface is preferably inclined to a specific direction from the <0001> direction. Also, the substrate for use in the present invention is preferably subjected to a pretreatment, such as organic cleaning or etching, before the first step, because the substrate surface can be kept in a constant state.

Examples of the material which can be used as the Group III raw material supplied in the first step of the present invention include trimethylaluminum, triethylaluminum, tert-butylaluminum, trimethyl-gallium, triethylgallium, tert-butyl-gallium, trimethylindium, triethylindium, tert-butylindium and cyclopentadienyl indium. The Group III raw material preferably contains at least Al, such as trimethylaluminum, triethyl-aluminum and tert-butylaluminum, because the nitride containing aluminum has a high decomposition temperature and this provides effects such that decomposition or sublimation scarcely occurs even at a high temperature and that the crystal readily grows on the substrate.

In the first step of the present invention, a Group V raw material, such as ammonia, alkylamines and hydrazines, is supplied simultaneously with the Group III raw material to form a Group III nitride semiconductor. In the present invention, the V/III ratio at the time of supplying the Group III raw material in the first step is set to 1,000 or less, preferably 500 or less, more preferably 100 or less. By setting the V/III ratio as such, there is provided an effect that a compound semiconductor crystal having a more metal-excess is readily produced.

In the present invention, the V/III ratio may be 0, namely, the amount of the Group V raw material supplied may be 0. However, in this case, the Group III nitride semiconductor must be formed using nitrogen generated by the decomposition of materials adhering to the wall surface or ceiling of the reaction furnace or to the susceptor, though the amount of the intentionally supplied Group V raw material is 0. At this time, the composition and amount of materials adhering to the wall surface or ceiling of the reaction furnace or to the susceptor must be appropriately controlled. More specifically, these are controlled by adjusting the baking time or temperature in the reaction furnace after the completion of growth or by stopping the baking itself. Also, the time or temperature in the step, called thermal cleaning that is a general technique in the case of growth using a low-temperature buffer method, is also adjusted or the step itself is stopped.

For example, thermal cleaning is performed at 600° C. for 10 minutes without performing baking after the previous growth and thereafter, a first step of passing only a metal-containing compound, with the substrate heated to 1,000° C., and a subsequent second step of growing a crystal are performed, whereby a good Group III nitride semiconductor crystal can be produced.

Another condition for obtaining a good Group III nitride semiconductor crystal, with the V/III ratio set to 0 in the first step, is a method of using $N_2$ for the carrier gas and using, as the nitrogen source, the nitrogen (N) atom generated by the slight decomposition of $N_2$ at a temperature close to 1,000° C.

For the atmosphere gas in the first step of the present invention, a gas, such as hydrogen, rare gas or nitrogen, may be used alone or a mixed gas thereof may be used. In the case of using nitrogen for the atmosphere gas, as described above, the nitrogen gas sometimes functions also as the raw material gas.

The pressure in the atmosphere at the time of performing the first step is from 1,000 to $1 \times 10^5$ Pa, preferably $1 \times 10^5$ Pa or less, more preferably $1 \times 10^4$ Pa or less. When the pressure in the first step is low, the surface of a produced Group III nitride semiconductor layer having a metal-excess becomes flat. This provides an effect that the surface of a second Group III nitride semiconductor layer that will be grown on the flat surface can be readily flattened.

In the present invention, the temperature of the substrate at the time of performing the first step and the temperature of the substrate at the time of performing the second step are not particularly specified, but the substrate temperature in the first step is preferably the same as or higher than the substrate temperature in the subsequent second step. When the first step is performed at a temperature the same as or higher than the substrate temperature in the second step, this is advantageous in that decomposition of the organic metal compound molecule which is the Group III raw material gas proceeds efficiently and impurities, such as undecomposed alkyl groups, are not mixed into the formed crystal.

In the first step of the present invention, the Group III nitride semiconductor is formed as an island-like crystal grain More specifically, an aggregate of island-like crystal grains is formed, where island-like particle grains having a width of 1 to 500 nm and a height of approximately from 5 to 100 nm are densely gathered. By forming the Group III nitride as an island-like crystal, a large number of grain boundaries are generated in the crystal layer. This is considered to provide an effect that a metal crystal or liquid droplet readily remains in the boundaries to enable the crystal layer to function as a more metal-excess layer. The crystal layer may also have a structure where the distribution of island-like crystals is not so much dense and a substrate surface appears between crystal grains. In this case, the surface is interspersed with regions different in the crystal growth rate, and the density of threading dislocations is reduced by virtue of the selective growth effect. As a result, a more advantageous crystal can be produced.

Alternatively, in the first step of the present invention, the Group III nitride semiconductor is formed as a columnar crystal. More specifically, a columnar crystal where columnar grains having a width of 0.1 to 100 nm and a height of approximately from 10 to 500 nm are gathered is formed. By forming the Group m nitride as a columnar crystal, a large number of grain boundaries are generated in the crystal layer. This is considered to provide an effect that a metal crystal or liquid droplet readily remains in the boundaries to enable the crystal layer to function as a more metal-excess layer.

In the second step of the present invention, a Group III raw material and a nitrogen raw material are used to vapor-phase-grow a Group III nitride semiconductor crystal on the substrate where a Group III nitride has been formed in the first step. The grown Group III nitride semiconductor crystal is preferably GaN because, among Group III nitride semiconductors, GaN readily undergoes two-dimensional growth and a flat crystal film is readily formed. When a flat and good crystal film is once produced with GaN, it is facilitated to manufacture thereon a semiconductor device structure using a Group III nitride semiconductor crystal layer having various compositions.

In the first or second step or both steps of the present invention, a metal-organic chemical vapor deposition (MOCVD) method and a vapor-phase epitaxy (VPE) method can be used as the vapor-phase growth method. Among these, the MOCVD method is preferred because, for example, the decomposition rate of the Group III raw material can be adjusted and the growth rate is proper. Furthermore, according to the MOCVD method, various device structures having good properties can be produced on the crystal without taking the flattened substrate out of the reaction furnace.

In the case of growing a Group III nitride semiconductor crystal by the MOCVD method in the second step, the substrate temperature is preferably from 950 to 1,200° C. and the atmosphere pressure is preferably from 1,000 to $1 \times 10^5$ Pa.

The nitrogen raw material for use in the second step is preferably ammonia ($NH_3$) because this is a gas and is easy to handle, many ammonia products are available on the market and the cost thereof is low. As the Group III raw material, trimethylaluminum, triethylaluminum, tert-butylaluminum, trimethylgallium, triethylgallium, tert-butylgallium, trimethylindium, triethylindium, tert-butylindium and cyclopentadienyl indium can be used. At the time of growing a Group III nitride semiconductor crystal in the second step, the WM ratio is preferably from 500 to 20,000.

According to the production method of a group III nitride semiconductor crystal comprising the above-described first and second steps of the present invention, a Group III nitride semiconductor crystal having high homogeneity and good crystallinity can be formed on a substrate by a short-time process with reduced consumption of electric power. When a Group III nitride semiconductor crystal layer is further formed on the above-described Group III nitride semiconductor crystal, a Group III nitride semiconductor epitaxial wafer having a stacked layer structure, which is used for the manufacture of a light-emitting diode, a laser diode, an electronic device and the like, can be produced.

The present invention will be described below in greater detail with reference to Examples.

Example 1

The method of the present invention for producing a gallium nitride-based compound semiconductor crystal is described below.

In Example 1, the first step is a treatment of passing onto a sapphire substrate both a gas that contains a gas obtained by mixing trimethylaluminum (TMAl) vapor with trimethylgallium (TMGa) vapor at a molar ratio of 1:2 and a gas that contains ammonia ($NH_3$), and the second step is a treatment of growing gallium nitride while passing TMGa and ammonia. The two treatments were performed to produce a GaN layer composed of gallium nitride crystal on the sapphire substrate. Under the conditions used in the first step, the V/III ratio was about 85.

A sample containing this GaN layer was produced by the MOCVD method according to the following procedure.

Before introducing a sapphire substrate, the materials having adhered to the inside of the reaction furnace in the previous growth performed in the same apparatus were nitrided by heating in a gas containing ammonia and hydrogen to thereby prevent more decomposition thereof. The reaction furnace was made of quartz. After waiting until the reaction furnace was cooled to room temperature, the reaction furnace was provided within an RF coil of an induction heater. A sapphire substrate was introduced into the furnace and placed on a carbon-made susceptor for heating in a glove box purged with nitrogen gas. After the sample was introduced, nitrogen gas was passed to purge the inside of the reaction furnace.

The nitrogen gas was passed over 10 minutes and thereafter, the induction heater was actuated to elevate the substrate temperature to 1,170° C. over 10 minutes. The substrate was kept at a temperature of 1,170° C. and in this state, left standing for 9 minutes while passing hydrogen gas and nitrogen gas to perform thermal cleaning of the substrate surface.

During the thermal cleaning, a hydrogen carrier gas was passed through pipes of containers (bubblers) containing starting materials, namely, trimethylgallium (TMGa) and trimethylaluminum (TMAl), to initiate bubbling. Here, the pipes were connected to the reaction furnace. Each bubbler was adjusted to a constant temperature using a thermobath for the temperature adjustment. Until the growth step was started, each of the TMGa vapor and TMAl vapor generated by the bubbling was passed together with the carrier gas into a pipe to a deharmarizing unit and discharged outside the system through the deharmarizing unit.

After the completion of thermal cleaning, the valve for the nitrogen carrier gas was turned to CLOSE and the hydrogen gas became the sole gas supplied into the reaction furnace.

Following the changeover of the carrier gas, the substrate temperature was lowered to 1,150° C. After confirming that the temperature was stabilized at 1,150° C., the valve of the pipe for ammonia was opened to start the passing of ammonia into the furnace. Subsequently, the valves of pipes for TMGa and TMAl were simultaneously changed over and a gas containing TMGa vapor and TMAl vapor was supplied into the reaction furnace to start the first step of attaching a Group III nitride semiconductor onto the sapphire substrate. The TMGa and TMAl supplied were controlled to mix at a molar ratio of 2:1 by means of a flow rate controller disposed in the pipe for bubbling, and the amount of ammonia was adjusted to give a V/III ratio of 85.

After the treatment for 6 minutes, the valves of the pipes for TMGa and TMAl were simultaneously changed over to stop the supply of a gas containing TMGa vapor and TMAl vapor into the reaction furnace. Subsequently, the supply of ammonia was also stopped and the system was kept as it was for 3 minutes.

After the annealing for 3 minutes, the valve of pipe for ammonia gas was changed over and the supply of ammonia gas into the furnace was again started. The ammonia was passed for 4 minutes and during this, the flow rate in the pipe for TMGa was adjusted with a flow rate controller. In the 4 minutes, the valve for TMGa was changed over to start the supply of TMGa into the reaction furnace, thereby starting the growth of GaN.

After the growth of GaN layer over about 1 hour, the valve of the pipe for TMGa was changed over to stop the supply of the raw material to the reaction furnace, thereby stopping the growth.

Following the completion of the growth of the GaN layer, the passing of current to the induction heater was stopped and the substrate temperature was lowered to room temperature over 20 minutes. During the lowering of temperature, the atmosphere inside the reaction furnace was constituted of ammonia, nitrogen and hydrogen similarly to that during growth but after confirming that the substrate temperature was lowered to 300° C., the supply of ammonia and hydrogen was stopped. Thereafter, the substrate temperature was lowered to room temperature while passing nitrogen gas and then, the sample was taken out into an air.

Through these steps, a sample was produced, where a metal-excess Group III nitride semiconductor layer having a columnar structure was formed on the sapphire substrate and an undoped GaN layer having a thickness of 2 μm was formed thereon. The substrate taken out assumed a color tinged with black like a metal. This revealed that the Group III nitride semiconductor layer formed on the interface with the substrate was in a metal-excess stoichiometry. The growth surface was a mirror face.

The undoped GaN layer grown by the above-described method was measured on the X-ray rocking curve (XRC). In the measurement, a Cuβ-line X-ray generator was used as the light source and the measurement was performed for (0002) planes as symmetric planes and (10-12) planes as asymmetric planes. Generally, in the case of a gallium nitride-based compound semiconductor, the half width on the XRC spectrum of (0002) planes is used as an index for the flatness (mosaicity) and the half width on the XRC spectrum of (10-12) planes is used as an index for the dislocation density (twist).

As a result of the measurement, the undoped GaN layer produced by the method of the present invention exhibited a half width of 230 seconds for (0002) planes and 350 seconds for (10-12) planes.

Furthermore, the outermost surface of the GaN layer was observed using a general atomic force microscope (AFM) and, as a result, no growth pit was observed on the surface and a surface having good morphology was confirmed.

The cross section of this sample was observed through a transmission electron microscope (TEM) and, as a result, an AlN film having a large number of grain boundaries in the direction almost perpendicular to the substrate surface was confirmed at the interface between the sapphire substrate and the gallium nitride layer. The film thickness was about 60 nm and the distance between grain boundaries was from 5 to 50 nm. This layer was considered to be a layer comprising an aggregate of columnar crystals longer in the height than in the width. According to the elemental analysis, this film contained about 20% of Ga.

Example 2

In Example 2, the test was performed through almost the same steps as in Example 1 except that the growth time of the Group III nitride semiconductor in the first step was 2 minutes. Also in this case, the wafer taken out had a mirror surface and was colorless and transparent.

The cross section of the sample was observed through a transmission electron microscope (TEM) and, as a result, it was confirmed that island-like AlN crystal grains were present on the interface between the sapphire substrate and the gallium nitride layer. According to the elemental analysis, this crystal grain contained about 15% of Ga.

The same growth as in the process of this experiment was performed except that before the growth of the gallium nitride layer, the process was stopped and the sample was taken out from the growing furnace, thereby producing a sample. The morphology of the surface was observed through an atomic force microscope (AFM) and, as a result, aluminum nitride crystal grains having a rounded hexagonal shape when viewed from above and having a trapezoidal cross section were interspersed.

Example 3

In Example 3, a sapphire substrate was introduced into the reaction furnace without practicing the baking before performing the growth after the previous experiment, and a first step of passing a gas containing trimethylaluminum (TMAl) vapor and a second step of passing TMGa and ammonia to grow gallium nitride were performed to produce a GaN layer comprising a gallium nitride crystal on the sapphire substrate. The V/III ratio intended in this Example was 0 but due to decomposition of materials adhering to the wall surface or ceiling of the reaction furnace, a small amount of N atom was supplied onto the substrate.

A sample containing this GaN layer was produced using the MOCVD method in accordance with the following procedure.

A sapphire substrate was introduced into a quartz-made reaction furnace provided in an RF coil of an induction heater. The sapphire substrate was placed on a carbon-made susceptor for heating in a glove box purged with nitrogen gas. After the sample was introduced, nitrogen gas was passed to purge the inside of the reaction furnace.

The nitrogen gas was passed over 10 minutes and thereafter, the induction heater was actuated to elevate the substrate temperature to 600° C. over 10 minutes. The substrate was kept at a temperature of 600° C. and in this state, left standing for 9 minutes while passing hydrogen gas.

During this, a hydrogen carrier gas was passed through pipes of containers (bubblers) containing starting materials, namely trimethylgallium (TMGa) and trimethylaluminum (TMAl), to initiate bubbling. Here, the pipes were connected to the reaction furnace. Each bubbler was adjusted to a constant temperature using a thermobath for the temperature adjustment. Until the growth step was started, each of the TMGa vapor and TMAl vapor generated by the bubbling was passed together with the carrier gas into a pipe to a deharmarizing unit and discharged outside the system through the deharmarizing unit.

Thereafter, the valve for the nitrogen carrier gas was turned to CLOSE and the supply of hydrogen gas into the reaction furnace was started.

Following the changeover of the carrier gas, the substrate temperature was elevated to 1,150° C. After confirming that the temperature was stabilized at 1,150° C., the valve of the pipe for TMAl was changed over and a gas containing TMAl vapor was supplied into the reaction furnace. At this time, it is considered that due to decomposition of materials adhering to the wall surface or ceiling of the reaction furnace, a small amount of N was supplied onto the substrate simultaneously with TMAl.

After the treatment for 9 minutes, the valve of the pipe for TMAl was changed over to stop the supply of a gas containing TMAl vapor into the reaction furnace and the system was kept as it was for 3 minutes.

After annealing for 3 minutes, the valve of pipe for ammonia gas was changed over and the supply of ammonia gas into the furnace was again started.

The ammonia was passed for 4 minutes and during this, the flow rate in the pipe for TMGa was adjusted with a flow rate controller. In the 4 minutes, the valve for TMGa was changed over to start the supply of TMGa into the furnace, thereby starting the growth of GaN.

After the growth of GaN-layer over about 1 hour, the valve of the pipe for TMGa was changed over to stop the supply of the raw material to the reaction furnace, thereby stopping the growth.

Following the completion of the growth of the GaN layer, the passing of current to the induction heater was stopped and the substrate temperature was lowered to room temperature over 20 minutes. During the lowering of temperature, the atmosphere inside the reaction furnace was constituted of ammonia, nitrogen and hydrogen similarly to that during growth but after confirming that the substrate temperature was lowered to 300° C., the supply of ammonia and hydrogen was stopped. Thereafter, the substrate temperature was lowered to room temperature while passing nitrogen gas and then, the sample was taken out into an air.

Through these steps, a sample was produced, where a metal-excess Group III nitride semiconductor layer having a columnar structure was formed on the sapphire substrate in the first step and an undoped GaN layer having a thickness of 2 μm was formed thereon. The substrate taken out assumed a color tinged with black like a metal similarly to Example 1. This revealed that the Group III nitride semiconductor formed on the interface with the substrate was in a metal-excess stoichiometry. The growth surface was a mirror face.

The undoped GaN layer grown by the above-described method was measured on XRC. In the measurement, a Cup-line X-ray generator was used as the light source and the measurement was performed for (0002) planes as symmetric planes and (10-12) planes as asymmetric planes. As a result of the measurement, the undoped GaN layer produced by the method of the present invention exhibited a half width of 200 seconds for (0002) planes and 330 seconds for (10-12) planes.

Furthermore, the outermost surface of the GaN layer was observed using a general atomic force microscope (AFM) and, as a result, growth pits were not observed on the surface and a surface having good morphology was confirmed.

The cross section of this sample was observed through a transmission electron microscope (TEM) and, as a result, an AlN film having a large number of grain boundaries in the direction almost perpendicular to the substrate surface was confirmed at the interface between the sapphire substrate and the gallium nitride layer. The film thickness was about 20 nm and the distance between grain boundaries was from 10 to 50 nm. This layer was considered to be a layer comprising an aggregate of columnar crystals longer in the height than in the width. According to the elemental analysis, this film contained about 5% of Ga.

Example 4

In Example 4, the first step was a treatment of passing onto a sapphire substrate a gas that contains a gas obtained by mixing trimethylaluminum (TMAl) vapor with trimethylindium (TMIn) vapor at a molar ratio of 2:1 using nitrogen as the carrier gas, and the second step was a treatment of growing a GaN layer while passing TMGa and ammonia. The two treatments were performed to produce a GaN layer composed of gallium nitride crystal on the sapphire substrate. It is considered that in the first step, the nitrogen gas used as the carrier gas was slightly decomposed and a small amount of nitrogen atom was supplied.

A sample containing this GaN layer was produced by the MOCVD method in accordance with the following procedure.

Before introducing a sapphire substrate, the materials having adhered to the inside of the reaction furnace in the previous growth performed in the same apparatus were nitrided by heating in a gas containing ammonia and hydrogen to thereby prevent more decomposition thereof. The reaction furnace was made of quartz. After waiting until the reaction furnace was cooled to room temperature, the reaction furnace was provided within an RF coil of an induction heater. A sapphire substrate was introduced into the furnace and placed on a carbon-made susceptor for heating in a glove box purged with nitrogen gas. After the sample was introduced, nitrogen gas was passed to purge the inside of the reaction furnace.

The nitrogen gas was passed over 10 minutes and thereafter, the induction heater was actuated to elevate the substrate temperature to 1,170° C. over 10 minutes. The substrate was kept at a temperature of 1,170° C. and in this state, left standing for 9 minutes while passing hydrogen to perform thermal cleaning of the substrate surface.

During the thermal cleaning, a hydrogen carrier gas was passed through pipes of containers (bubblers) containing starting materials, namely trimethylgallium (TMGa), trimethylaluminum (TMAl) and trimethylindium (TMIn), to initiate bubbling. Here, the pipes were connected to the reaction furnace. Each bubbler was adjusted to a constant temperature using a thermobath for the temperature adjustment. Until the growth step was started, each of the TMGa vapor, TMAl vapor and TMIn vapor generated by the bubbling was passed together with the carrier gas into a pipe to a deharmarizing unit and discharged outside the system through the deharmarizing unit.

After the completion of thermal cleaning, the valve for the hydrogen carrier gas was turned to CLOSE and the supply valve for nitrogen gas was turned to OPEN to change the gas supplied into the reaction furnace to nitrogen.

Following the changeover of the carrier gas, the substrate temperature was lowered to 1,150° C. After confirming that the temperature was stabilized at 1,150° C., the valves of the pipes for TMIn and TMAl were simultaneously changed over and a gas containing TMIn vapor and TMAl vapor was supplied into the reaction furnace to start the first step of attaching a Group III nitride semiconductor on the sapphire substrate. The TMIn and TMAl supplied were controlled to mix at a molar ratio of 1:2 with a flow rate controller disposed in the pipe for bubbling.

After the treatment for 6 minutes, the valves of the pipes for TMIn and TMAl were simultaneously changed over to stop the supply of a gas containing TMIn vapor and TMAl vapor into the reaction furnace and the system was kept as it was for 3 minutes.

After the annealing for 3 minutes, the valve of pipe for ammonia gas was changed over and the supply of ammonia gas into the furnace was started.

The ammonia was passed for 4 minutes and during this, the flow rate in the pipe for TMGa was adjusted with a flow rate controller. On the 4 minutes, the valve for TMGa was changed over to start the supply of TMGa into the furnace and the growth of GaN was started.

After the growth of GaN layer over about 1 hour, the valve of the pipe for TMGa was changed over to stop the supply of the raw material to the reaction furnace and the growth was stopped.

Following the completion of the growth of the GaN layer, the passing of current to the induction heater was stopped and the substrate temperature was lowered to room temperature over 20 minutes. During the lowering of temperature, the atmosphere inside the reaction furnace was constituted of ammonia, nitrogen and hydrogen similarly to that during growth but after confirming that the substrate temperature was lowered to 300° C., the supply of ammonia and hydrogen was stopped. Thereafter, the substrate temperature was lowered to room temperature while passing nitrogen gas and then, the sample was taken out into an air.

Through these steps, a sample was produced, where a metal-excess Group III nitride semiconductor layer having a columnar structure was formed on the sapphire substrate and an undoped GaN layer having a thickness of 2 μm was formed thereon. The substrate taken out was colorless and transparent. The growth surface was a mirror face.

The undoped GaN layer grown through the above-described method was measured on XRC. In the measurement, a CO-line X-ray generator was used as the light source and the measurement was performed for (0002) planes as symmetric planes and (10-12) planes as asymmetric planes.

As a result of the measurement, the undoped GaN layer produced by the method of the present invention exhibited a half width of 350 seconds for (0002) planes and 400 seconds for (10-12) planes.

Furthermore, the outermost surface of the GaN layer was observed using a general atomic force microscope (AFM). As a result, no growth pit was observed on the surface and a surface having good morphology was confirmed.

The cross section of this sample was observed through a transmission electron microscope (TEM) and, as a result, an AlN film having a large number of grain boundaries in the direction almost perpendicular to the substrate surface was confirmed at the interface between the sapphire substrate and the gallium nitride layer. The film thickness was about 10 nm and the distance between grain boundaries was from 5 to 50 nm. This layer was considered to be a layer comprising an aggregate of columnar crystals longer in the height than in the width.

Example 5

In Example 5, the method for producing a gallium nitride-based compound semiconductor light-emitting device using the production method of Group III nitride semiconductor crystal of the present invention is described.

In Example 5, a flat and low Si-doped GaN crystal was produced using the same conditions as in Example 3 and further thereon, a Group III nitride semiconductor crystal layer was formed to finally produce an epitaxial wafer, shown in FIG. 1, having an epitaxial layer structure for semiconductor light-emitting devices. That is, the epitaxial wafer has a structure where a metal-excess AlN layer 8 having a columnar structure is formed on a sapphire substrate 9 having a c plane by the same growth method as in Example 3 and thereafter, the following layers were stacked sequentially from the substrate side. The layers are a 2 μm-thick low Si-doped GaN layer 7 having an electron concentration of $1\times10^{17}$ cm$^{-3}$, a 1.8 μm-thick high Si doped GaN layer having an electron concentration of $1\times10^{19}$ cm$^{-3}$, a 100 Å-thick In$_{0.1}$Ga$_{0.9}$N cladding layer 5 having an electron concentration of $1\times10^{17}$ cm$^{-3}$, a multiple quantum well structure 20 that consists of six GaN barrier layers 3 having a thickness of 70 Å and four non-doped In$_{0.2}$Ga$_{0.8}$N well layers 4 having a thickness of 20 Å, starts with a GaN barrier layer and ends with a GaN barrier layer, a 30 Å-thick non-doped Al$_{0.2}$Ga$_{0.8}$N diffusion-inhibiting layer 2, and a 0.15 μm-thick Mg-doped GaN layer 1 having a hole concentration of $8\times10^{17}$ cm$^{-3}$.

Figure 2:
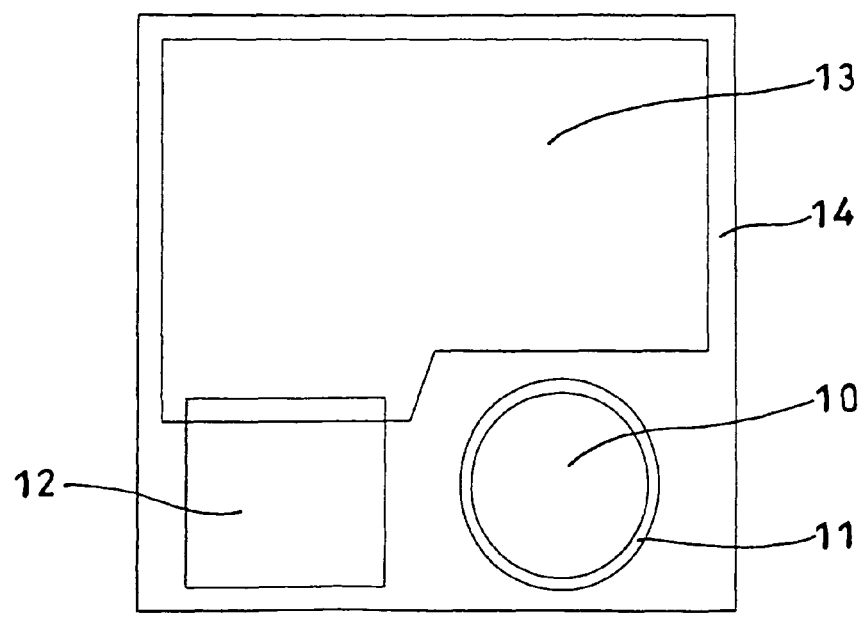
FIG. 2 is a plan view showing the electrode structure of the same semiconductor light-emitting device.

FIG. 2 is a plan view showing the electrode structure of the semiconductor light-emitting device produced in Example 5.

The wafer having epitaxial layers in the above-described semiconductor light-emitting device structure was produced by the MOCVD method according to the following procedure.

Until the formation of the AlN layer 8 having a columnar structure on the sapphire substrate, the same procedure as in Example 3 was employed.

After the AlN layer 8 having a columnar structure was formed on the sapphire substrate, the flow rate in the pipe for TMGa was adjusted with the flow rate controller while continuously passing ammonia. Also, the passing of Si$_2$H$_6$ to the pipe was started. Until the growth of the low Si-doped GaN layer was started, Si$_2$H$_6$ was passed together with the carrier gas into a pipe to a deharmarizing unit and discharged outside the system through the deharmarizing unit. Thereafter, the valves for TMGa and Si$_2$H$_6$ were changed over to start the supply of TMGa and Si$_2$H$_6$ into the furnace and the growth of the low-doped GaN was started. The GaN layer was grown over about 1 hour and 15 minutes. The amount of SiH$_4$ passed was previously examined and controlled to provide a low Si-doped GaN layer having an electron concentration of $1\times10^{17}$ cm$^{-3}$.

Thus, the low Si-doped GaN layer 7 having a thickness of 2 μm was formed.

On this low Si-doped GaN layer 7, the high Si-doped n-type GaN layer 6 was grown. After the growth of the low Si-doped GaN layer, the supply of TMGa and Si$_2$H$_6$ into the furnace was stopped for 1 minute. During this, the amount of Si$_2$H$_6$ passed was changed. The amount passed was previously examined and adjusted to provide a high Si-doped GaN layer having an electron concentration of $1\times10^{19}$ cm$^{-3}$. Ammonia was continuously supplied into the furnace without changing the flow rate. In the 1 minute the supply of TMGa and Si$_2$H$_6$ was restarted to perform growth over 1 hour. By this operation, the high Si-doped GaN layer having a thickness of 1.8 μm was formed.

After the high Si-doped GaN layer 6 was grown, the valves for TMGa and Si$_2$H$_6$ were changed over and the supply of these raw materials into the furnace was stopped. While passing ammonia as it was, the valve was changed over to change over the carrier gas from hydrogen to nitrogen. Thereafter the substrate temperature was lowered from 1,160° C. to 800° C.

During the time of waiting the change of temperature inside the furnace, the amount of $Si_2H_6$ supplied was changed. The amount passed was previously examined and adjusted to provide an Si-doped InGaN cladding layer having an electron concentration of $1\times10^{17}$ cm$^{-3}$. Ammonia was continuously supplied into the furnace without changing the flow rate.

The passing of the carrier gas into the bubblers of trimethylindium (TMIn) and triethylgallium (TEGa) was started in advance. Until the growth step of the cladding layer was started, each of the $Si_2H_6$ gas and the TMIn vapor and TEGa vapor generated by the bubbling was passed together with the carrier gas into the pipe to a deharmarizing unit and discharged outside the system through the deharmarizing unit.

Thereafter, when the state inside the furnace was stabilized, the valves for TMIn, TEGa and $Si_2H_6$ were simultaneously changed over and the supply of these raw materials into the furnace was started. The supply was continued over about 10 minutes to form an Si-doped $In_{0.1}Ga_{0.9}N$ cladding layer 5 having a thickness of 100 Å.

Subsequently, the valves for TMIn, TEGa and $Si_2H_6$ were changed over and the supply of these raw materials was stopped.

Then, the multiple quantum well structure 20 constituted of a barrier layer 3 of GaN and a well layer of $In_{0.2}Ga_{0.8}N$ was produced. In the production of the multiple quantum well structure, a GaN barrier layer 3 was first formed on the Si-doped $In_{0.1}Ga_{0.9}N$ cladding layer 5 and an $In_{0.2}Ga_{0.8}N$ well layer 4 was formed on the thus formed GaN barrier layer. This structure was repeated 5 times to stack layers and on the 5th $In_{0.2}Ga_{0.8}N$ well layer, the 6th GaN barrier layer was formed to complete a structure having a GaN barrier layer 3 on both sides of the multiple quantum well structure 20.

More specifically, after the completion of the growth of Si-dope $In_{0.1}Ga_{0.9}N$ cladding layer, the supply was stopped over 30 seconds and then, while not changing the substrate temperature, the pressure in the furnace and the flow rate and kind of the carrier gas, the valve for TEGa was changed over to supply TEGa into the furnace. After TEGa was supplied over 7 minutes, the valve was again changed over to stop the supply of TEGa and the growth of the GaN barrier layer was completed. As a result, the GaN barrier layer 3 having a thickness of 70 Å was formed.

During the growth of the GaN barrier layer, the flow rate of TMIn passing into the pipe to the deharmarizing unit was adjusted to 2 times in terms of the molar flow rate as compared with that at the growth of the cladding layer.

After the growth of the GaN barrier layer was completed, the supply of the Group III raw material was stopped over 30 seconds and while not changing the substrate temperature, the pressure in the furnace and the flow rate and kind of the carrier gas, the valves for TEGa and TMIn were changed over to supply TEGa and TMIn into the furnace. After TEGa and TMIn were supplied over 2 minutes, the valves were again changed over to stop the supply of TEGa and TMIn and the growth of the $In_{0.2}Ga_{0.8}N$ well layer was completed. As a result, the $In_{0.2}Ga_{0.8}N$ well layer 4 having a thickness of 20 Å was formed.

After the growth of the $In_{0.2}Ga_{0.8}N$ well layer was completed, the supply of the Group III raw material was stopped over 30 seconds and while not changing the substrate temperature, the pressure in the furnace and the flow rate and kind of the carrier gas, the supply of TEGa into the furnace was started and a GaN barrier layer was again grown.

This procedure was repeated 5 times to produce five GaN barrier layers and five $In_{0.2}Ga_{0.8}N$ well layers. On the final $In_{0.2}Ga_{0.8}N$ well layer, a GaN barrier layer was further formed.

On this multiple quantum well structure 20 ending with the GaN barrier layer, the non-doped $Al_{0.2}Ga_{0.8}N$ diffusion-inhibiting layer 2 was produced.

The passing of the carrier gas into the bubbler containing trimethylaluminum (TMAl) was started in advance. Until the growth step of the diffusion-inhibiting layer was started, the TMAl vapor generated by the bubbling was passed together with the carrier gas into a pipe to a deharmarizing unit and discharged outside the system through the deharmarizing unit.

After waiting until the pressure inside the furnace was stabilized, the valves for TEGa and TMAl were changed over to start the supply of these raw materials into the furnace. Thereafter, the growth was performed over about 3 minutes. Then, the supply of TEGa and TMAl was stopped to terminate the growth of the non-doped $Al_{0.2}Ga_{0.8}N$ diffusion-inhibiting layer. As a result, the non-doped $Al_{0.2}Ga_{0.8}N$ diffusion-inhibiting layer 2 having a thickness of 30 Å was formed.

On this non-doped $Al_{0.2}Ga_{0.8}N$ diffusion-inhibiting layer, the Mg-doped GaN layer 1 was produced.

After the supply of TEGa and TMAl was stopped and the growth of the non-doped $Al_{0.2}Ga_{0.8}N$ diffusion-inhibiting layer was completed, the substrate temperature was elevated to 1,060° C. over 2 minutes. Furthermore, the carrier gas was changed to hydrogen.

The passing of the carrier gas into the bubbler containing biscyclopentadienyl magnesium ($Cp_2Mg$) was started in advance. Until the growth step of the Mg-doped GaN layer was started, the $Cp_2Mg$ vapor generated by the bubbling was passed together with the carrier gas into a pipe to a deharmarizing unit and discharged outside the system through the deharmarizing unit.

After changing the temperature and pressure and waiting until the pressure in the furnace was stabilized, the valves for TMGa and $Cp_2Mg$ were changed over and the supply of these raw materials into the furnace was started. The amount of $Cp_2Mg$ passed was previously examined and adjusted to provide an Mg-doped GaN cladding layer having a hole concentration of $8\times10^{17}$ cm$^{-3}$. Thereafter, the growth was performed over about 6 minutes. Then, the supply of TMGa and $Cp_2Mg$ was stopped to terminate the growth of the Mg-doped GaN layer. As a result, the Mg-doped GaN layer 1 having a thickness of 0.15 μm was formed.

After the growth of the Mg-doped GaN layer was completed, the passing of current to the induction heater was stopped and the substrate temperature was lowered to room temperature over 20 minutes. During the lowering from the growth temperature to 300° C., the carrier gas within the reaction furnace was constituted only of nitrogen, and $NH_3$ in a volume of 1% was passed. When it was confirmed that the substrate temperature was lowered to 300° C., the passing of $NH_3$ was stopped and the atmosphere gas became only nitrogen. After confirming that the substrate temperature was lowered to room temperature, the wafer was taken out into the air.

Through such procedure, an epitaxial wafer having an epitaxial layer structure for semiconductor light-emitting devices was produced. Here, the Mg-doped GaN layer exhibited the p-type conduction although an annealing treatment for activating the p-type carrier was not performed.

Subsequently, a light-emitting diode, which is one of semiconductor light-emitting devices, was produced using the epitaxial wafer comprising a sapphire substrate having stacked thereon an epitaxial layer structure.

On the surface 14 of the Mg-doped GaN layer of the produced wafer, a p-electrode bonding pad 12 having a structure comprising titanium, aluminum and gold layers stacked in this order from the surface side and a light-transmitting p-electrode 13 joined to the pad and composed only of Au were formed by known photolithography to produce a p-side electrode.

Then, the wafer was subjected to dry etching to expose the high Si-doped GaN layer in the portion 11 where an n-side electrode is formed, and an n-electrode 10 comprising four layers of Ni, Al, Ti and Au was produced on the exposed portion. By such working, electrodes each having the shape as shown in FIG. 2 were produced on the wafer.

After forming the p-side and n-side electrodes on the wafer, the back surface of the sapphire substrate was ground and polished to provide a mirror face. Then, the wafer was cut into a square chip having a side of 350 µm, the chip was placed on a lead frame, with the electrodes directed upward, and a gold wire was connected to the lead flame, thereby completing a light-emitting device.

When a forward current was passed between the p-side and n-side electrodes of the thus produced light-emitting diode, the forward voltage at a current of 20 mA was 3.0 V. Furthermore, light emission was observed through the light-transmitting p-side electrode and, as a result, the emission wavelength was 470 nm and the emission output was 6 cd. These properties of the light-emitting diode were obtained without dispersion for light-emitting diodes using a chip cut out from almost the whole surface of the wafer produced.

INDUSTRIAL APPLICABILITY

When the production method of a Group III nitride semiconductor crystal of the present invention is used, the occasion of elevating or lowering the temperature is reduced. Therefore, the time necessary for the process is short and the amount of electric power consumed is small. This can curtail the production process and cost. Furthermore, by virtue of the small change in temperature, the warping of the substrate can be suppressed to the minimum and good homogeneity can be obtained in the properties of crystal.

As a result thereof, when a semiconductor light-emitting device is fabricated using a gallium nitride-based compound semiconductor produced by the production method of a Group III nitride semiconductor crystal of the present invention, a light-emitting diode having high brightness and nearly uniform properties in the plane of a wafer can be produced.

Also, according to the method of the present invention described in the foregoing, it is possible to produce a crystal small in the columnarity and dislocation density and capable of providing a device structure exhibiting good device properties as compared with a conventional method using AlN grown at high temperature.

The invention claimed is:

1. A method for producing a Group III nitride semiconductor crystal, comprising:
a first step of supplying a Group III raw material using $N_2$ for carrier gas at a pressure of 1,000 to $1 \times 10^4$ Pa into a reaction furnace having a wall surface and ceiling and having a susceptor to form and grow a polycrystalline Group III nitride semiconductor layer using nitrogen generated by the decomposition of materials adhering to the wall surface or ceiling of the reaction furnace or to the susceptor directly on a sapphire substrate heated to a temperature of 950° C. to 1,200° C. in the absence of a low-temperature buffer layer so that the Group III raw material is excessive in a stoichiometric ratio of the Group III raw material and the Group V raw material; and
consecutively, a second step of vapor-phase-growing a Group III nitride semiconductor crystal on the substrate heated to 950° C. to 1,200° C., at a temperature equal to or less than the temperature in the first step using a Group III raw material and a nitrogen raw material.

2. The method according to claim 1, wherein the Group III raw material supplied in the first step contains at least Al.

3. The method according to claim 1, wherein the Group III nitride semiconductor crystal vapor-phase-grown on the substrate in the second step comprises GaN.

4. The method according to claim 1, wherein in at least one of the first step and the second step, the growth is performed by the metal-organic chemical vapor deposition (MOCVD) method.

5. The method according to claim 1, wherein the nitrogen raw material used in the second step is ammonia ($NH_3$).

6. The method according to claim 1, wherein the Group III nitride semiconductor formed in the first step is an island-like crystal grain that is an aggregate of island-like crystal grains where island-like particle grains having a width of 1 to 500 nm and a height of approximately from 5 to 100 nm are densely gathered.

7. The method according to claim 1, wherein the Group III nitride semiconductor formed in the first step is a columnar crystal where columnar grains having a width of 0.1 to 100 nm and a height of approximately from 10 to 500 nm are gathered.

8. The method according to claim 7, wherein the columnar crystal is attached onto the substrate such that a side surface of the columnar crystal stands approximately perpendicular to a surface of the substrate.

9. The method according to claim 1, wherein the second step further comprises the step of supplying a Group III raw material and a Group V raw material at a V/III ratio of 500 to 20,000.

10. The method according to claim 1, wherein the polycrystalline Group III nitride semiconductor layer is formed of a plurality of single crystals.

11. A method for producing a Group III nitride semiconductor crystal, comprising:
a first step of producing, in the absence of a low-temperature buffer layer, a first Group III nitride semiconductor layer directly on a sapphire substrate heated to a temperature of 950° C. to 1,200° C. by supplying a Group III raw material into a reaction furnace having a wall surface and ceiling and having a susceptor and using nitrogen generated by the decomposition of materials adhering to the wall surface or ceiling of the reaction furnace or to the susceptor; and
consecutively, a second step of producing a second Group III nitride semiconductor crystal on the first Group III nitride semiconductor heated to 950° C. or more, at a temperature equal to or less than the temperature in the first step, wherein the first Group III nitride semiconductor layer is an aggregate of columnar crystals or island-like crystals.

12. The method according to claim 11, wherein the columnar crystals are attached onto the substrate such that each side surface of the columnar crystals stands approximately perpendicular to a surface of the substrate.

13. The method according to claim 11, wherein the second step further comprises the step of supplying a Group III raw material and a Group V raw material at a V/III ratio of 500 to 20,000.

* * * * *